United States Patent [19]

Nguyen et al.

[11] Patent Number: 5,956,615

[45] Date of Patent: *Sep. 21, 1999

[54] METHOD OF FORMING A METAL CONTACT TO LANDING PAD STRUCTURE IN AN INTEGRATED CIRCUIT

[75] Inventors: Loi N. Nguyen, Carrollton; Frank R. Bryant, Denton, both of Tex.

[73] Assignee: STMicroelectronics, Inc., Carrollton, Tex.

[*] Notice: This patent issued on a continued prosecution application filed under 37 CFR 1.53(d), and is subject to the twenty year patent term provisions of 35 U.S.C. 154(a)(2).

[21] Appl. No.: 08/362,655

[22] Filed: Dec. 22, 1994

[51] Int. Cl.$^6$ .................................................. H01L 21/44
[52] U.S. Cl. ......................... 438/657; 438/638; 438/668
[58] Field of Search .................................. 437/187, 191, 437/190, 195, 245; 257/754, 756, 773, 760; 438/657, 637, 638, 647, 668, 675

[56] References Cited

U.S. PATENT DOCUMENTS

| | | | |
|---|---|---|---|
| 4,441,247 | 4/1984 | Gargini et al. | 29/571 |
| 4,707,457 | 11/1987 | Erb | 437/193 |
| 4,782,380 | 11/1988 | Shankar et al. | 357/71 |

(List continued on next page.)

FOREIGN PATENT DOCUMENTS

| | | | |
|---|---|---|---|
| 0 369 336 A3 | 5/1990 | European Pat. Off. | H01L 21/90 |
| 0 380 327 A3 | 8/1990 | European Pat. Off. | H01L 23/522 |
| 9 503 904 A2 | 1/1992 | European Pat. Off. | H01L 21/90 |
| 0 499 433 A2 | 8/1992 | European Pat. Off. | H01L 21/90 |
| 0 566 253 A1 | 10/1993 | European Pat. Off. | H01L 23/485 |
| 62-272555 | 5/1986 | Japan . | |
| 62-136856 | 6/1987 | Japan . | |
| 62-27255 | 11/1987 | Japan . | |
| 304807 | 9/1989 | Japan . | |
| A 3016220 | 1/1991 | Japan | H01L 21/3205 |
| A 3073531 | 3/1991 | Japan | H01L 21/3205 |
| 4-307732 | 10/1992 | Japan . | |

OTHER PUBLICATIONS

Broadbent, et al., "Selective Low Pressure Chemical Vapor Deposition of Tungsten," J. Electrochem. Soc.: Solid–State Science and Technology, vol. 131, No. 6, pp. 1427–1433, Jun. 1984.
G. Queirolo, et al., "Dopant Activation, Carrier Mobility, and TEM Studies in Polycrystalline Silicon rilms", J. Electrochem. Soc., V. 137, No. 3, Mar. 1990, pp. 967–970.
C.S. Pai, et al., "Chemical Vapor Deposition of Selective Epitaxial Silicon Layers", J. Electrochem. Soc., V. 137, No. 3, Mar. 1990, pp. 971–976.
M. Cleeves, et al., "A Novel Disposable Post Technology for Self–Aligned Sub–Micron Contacts", 1994 IEEE, 1994 Symposium on VLSI Technology Digest of Technical Papers, pp. 61–62.

*Primary Examiner*—Caridad Everhart
*Attorney, Agent, or Firm*—Theodore E. Galanthay; Lisa K. Jorgenson; Dan Venglarik

[57] ABSTRACT

A method is provided for forming an improved landing pad of a semiconductor integrated circuit, and an integrated circuit formed according to the same. A first opening is formed through a first dielectric layer to expose a portion of a diffused region. A landing pad is formed over the first dielectric layer and in the opening. The landing pad preferably comprises a doped polysilicon layer disposed in the first opening and over a portion of the first dielectric layer. The landing pad will provide for smaller geometries and meet stringent design rules such as that for contact space to gate. A second dielectric layer having an opening therethrough is formed over the landing pad having an opening therethrough exposing a portion of the landing pad. A conductive contact, such as aluminum, is formed in the contact opening. The conductive contact will electrically connect with the diffused region through the landing pad. Misalignment of the conductive contact opening over the landing pad may be tolerated without invading design rules. Additionally, the landing pad will enhance planarization to provide for better step coverage of the metal contact in the second opening.

29 Claims, 5 Drawing Sheets

U.S. PATENT DOCUMENTS

| | | | |
|---|---|---|---|
| 4,789,885 | 12/1988 | Brighton et al. | 357/34 |
| 4,795,718 | 1/1989 | Beitman | 437/41 |
| 4,795,722 | 1/1989 | Welch et al. | 437/192 |
| 4,810,666 | 3/1989 | Taji | 437/30 |
| 4,822,749 | 4/1989 | Flanner et al. | 437/41 |
| 4,844,123 | 7/1989 | Dixit et al. | 357/71 |
| 4,844,776 | 7/1989 | Lee et al. | 156/653 |
| 4,851,895 | 7/1989 | Green et al. | 357/67 |
| 4,868,138 | 9/1989 | Chan et al. | 437/44 |
| 4,884,123 | 11/1989 | Dixit et al. | 357/71 |
| 4,908,332 | 3/1990 | Wu | 437/192 |
| 4,916,397 | 4/1990 | Masuda et al. | 357/71 |
| 4,922,311 | 5/1990 | Lee et al. . | |
| 4,944,410 | 7/1990 | Sun et al. | 437/192 |
| 4,984,056 | 1/1991 | Fujimoto et al. | 357/67 |
| 4,994,410 | 2/1991 | Sun et al. | 437/192 |
| 4,997,790 | 3/1991 | Woo et al. | 437/195 |
| 5,036,378 | 7/1991 | Lu et al. | 357/23.5 |
| 5,036,383 | 7/1991 | Mori | 357/71 |
| 5,071,783 | 12/1991 | Taguchi et al. | 437/52 |
| 5,081,516 | 1/1992 | Haskell | 357/42 |
| 5,110,752 | 5/1992 | Lu | 437/47 |
| 5,158,910 | 10/1992 | Coopes et al. | 437/195 |
| 5,192,715 | 3/1993 | Sliwa, Jr. et al. | 437/195 |
| 5,198,683 | 3/1993 | Sivan | 257/67 |
| 5,210,429 | 5/1993 | Adan | 257/67 |
| 5,214,305 | 5/1993 | Huang et al. | 257/413 |
| 5,219,789 | 6/1993 | Adan | 437/192 |
| 5,229,326 | 7/1993 | Dennison et al. | 437/195 |
| 5,236,867 | 8/1993 | Furuta et al. | 437/189 |
| 5,247,199 | 9/1993 | Matlock | 257/371 |
| 5,275,963 | 1/1994 | Cederbaum et al. . | |
| 5,275,972 | 1/1994 | Ogawa et al. | 437/195 |
| 5,293,053 | 3/1994 | Malhi et al. | 257/330 |
| 5,296,729 | 3/1994 | Yamanaka et al. | 257/377 |
| 5,298,463 | 3/1994 | Sandhu et al. | 437/192 |
| 5,298,792 | 3/1994 | Manning | 257/758 |
| 5,308,795 | 5/1994 | Hawley et al. | 437/195 |
| 5,315,141 | 5/1994 | Kim | 257/308 |
| 5,316,976 | 5/1994 | Bourg, Jr. et al. | 437/195 |
| 5,334,862 | 8/1994 | Manning et al. | 257/67 |
| 5,359,226 | 10/1994 | De Jong | 257/773 |
| 5,414,302 | 5/1995 | Shin et al. | 257/752 |
| 5,420,058 | 5/1995 | Lee et al. | 437/41 |
| 5,448,091 | 9/1995 | Bryant et al. | 257/315 |
| 5,514,622 | 5/1996 | Bornstein et al. | 437/189 |
| 5,541,137 | 7/1996 | Manning et al. | 437/162 |
| 5,581,093 | 12/1996 | Sakamoto | 257/67 |
| 5,596,212 | 1/1997 | Kuriyama | 257/298 |
| 5,604,382 | 2/1997 | Koyama | 257/774 |
| 5,616,934 | 4/1997 | Dennison et al. | 257/67 |
| 5,633,196 | 5/1997 | Zamanian | 438/653 |

METHOD OF FORMING A METAL CONTACT TO LANDING PAD STRUCTURE IN AN INTEGRATED CIRCUIT

This application is related to the subject matter of U.S. patent application Ser. No. 08/251,025 filed May 31, 1994, now U.S. Pat. No. 5,633,196, assigned to SGS-Thomson Microelectronics, Inc. and incorporated herein by reference.

FIELD OF THE INVENTION

The present invention relates generally to semiconductor integrated circuit processing, and more specifically to an improved method of forming a landing pad structure under a metal contact.

BACKGROUND OF THE INVENTION

Design rules are required in integrated circuit design which allow for variations in the fabrication processes to protect against catastrophic failures and to guarantee the electrical parameters of the devices; the electrical parameters being related to the physical dimensions of the features. Certain feature sizes and minimum space or design tolerance must be maintained between devices in order to maintain the electrical integrity of the devices. Shapes and sizes may vary as a result of, for example, mask misalignment or variations in photoresist exposure. Design rules have thus been established for the various types of material used and the particular location of the devices on the chip, for example, width and spacing rules exist for metal, diffusion and polysilicon materials as well as for contact openings such as a metal contact space to gate. Any misalignment in the formation of a metal contact, for example to a diffused region, may invade the required space between the contact and a surrounding device such as the polysilicon gate. Thus, reduction in the minimum required spacing will not meet the design tolerance and will not insure the devices' electrical characteristics.

To avoid the problems caused by a metal contact when misalignment or other spacing problems occur between, for example, the metal contact and gate, a landing pad may be formed between the metal contact and an underlying diffused region. The landing pad may be formed from a polysilicon layer over which a silicide layer may be formed to decrease sheet resistance. Due to the design rules for polysilicon, the landing pad will allow for a reduction in the size of the cell and tolerate greater misalignment problems. The landing pad, however, creates a topography problem for subsequently formed layers. Depending on the actual layout, the contact opening formed over the landing pad may have a higher aspect ratio, the height of the contact opening divided by the width of the opening, than an opening formed without a landing pad. The larger the aspect ratio, the more difficult it will be to fill a contact opening.

An additional problem in the field of integrated circuit manufacture, particularly with the continuing trend toward smaller integrated circuit feature sizes, is the making of high-reliability conductive electrical contacts between metallization layers and semiconductor elements, particularly contacts between aluminum and diffused junctions into single-crystal silicon. This increased difficulty is due to the tendency for aluminum and silicon to interdiffuse when in contact with one another, and when subjected to the high temperatures necessary for integrated circuit manufacturing. As is well known in the art, conventional integrated circuit process steps can cause silicon from the substrate to diffuse rather rapidly into pure aluminum in an attempt to satisfy the solubility of silicon in aluminum. The silicon exiting the substrate is then replaced by the newly formed aluminum+silicon alloy. The diffusion back into the substrate of the aluminum+silicon alloy may diffuse to such a depth as to short out a shallow p-n junction in the silicon. This phenomenon is known as junction spiking. The use of silicon-doped aluminum in forming integrated circuit metallization, while preventing junction spiking, is known to introduce the vulnerability of the contact junction to the formation of silicon nodules thereat, such nodules effectively reducing the contact area, and thus significantly reducing the conductivity of the contact.

Accordingly, recent advances in the field of integrated circuit fabrication have been made by the introduction of so-called "barrier" layers at the aluminum-silicon interface. Conventionally, the barrier layer is a refractory metal material such as titanium-tungsten (TiW), or a refractory metal nitride such as titanium nitride (TiN). The barrier layer is formed at the contact location so as to be disposed between the silicon and the overlying aluminum layer. In some cases, the barrier layer is formed by deposition of the refractory metal, followed by an anneal which forms both the barrier layer and also a metal silicide where the metal is in contact with the silicon; as is known in the art, the metal silicide improves the conductivity of the contact. In any case, the barrier layer inhibits the interdiffusion of aluminum and silicon atoms, thus eliminating the problems of junction spiking and silicon nodule formation noted above.

While a barrier layer eliminates the problems associated with aluminum in direct contact with silicon, it is difficult to form a uniform barrier in contact openings that have a large aspect ratio such as that in contact with a landing pad. Even with today's deposition technology including chemical vapor deposition (CVD) and collimated sputtering, it is often hard to uniformly coat all sides in an opening, particularly in the corners of the openings. If the barrier layer is not thick enough, pin holes may result from inadequate coverage, resulting in the junction spiking problem noted above, to occur.

It is therefore an object of the present invention to provide a method of forming an integrated circuit with a landing pad in such a manner as to reduce the aspect ratio of the metal contact opening.

It is a further object of the present invention to provide such a method that provides more planarization for subsequent processing steps which will improve step coverage of subsequently formed barrier layers and metal contacts.

It is yet a further object of the present invention to provide such a method that tolerates misalignment of subsequently formed contact openings.

Other objects and advantages of the present method will be apparent to those of ordinary skill in the art having reference to the following specification together with the drawings.

SUMMARY OF THE INVENTION

The invention may be incorporated into a method for forming a semiconductor device structure, and the semiconductor device structure formed thereby. An active or diffused region is formed on a substrate. A first dielectric layer having a first opening therethrough is formed over the active region. A landing pad is formed over the first dielectric and in the first opening. The landing pad is preferably formed of a doped polysilicon layer. The landing pad is formed by filling the opening to the active or diffused region with the polysilicon to form a plug and forming a polysilicon region above the polysilicon plug and over the first dielectric layer adjacent the opening. The polysilicon plug and polysilicon region above the plug may be formed from the same of different layers. A second dielectric layer is formed over the landing pad with an opening therethrough to expose a portion of the landing pad. A metal contact can be made in the second opening to the active region through the landing pad. This second opening preferably has a smaller aspect ratio than the first opening to facilitate better step coverage of barrier layer and metal contact in the opening.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of illustrative embodiments when read in conjunction with the accompanying drawings, wherein:

DETAILED DESCRIPTION OF THE PREFERRED EMBODIMENTS

Referring now to FIGS. 1–4, a method of fabricating an integrated circuit to have a landing pad according to a first embodiment of the present invention will now be described in detail. The cross-sections of FIGS. 1–4 illustrate this method as a portion of an overall process flow for fabricating the integrated circuit. As will be apparent to those of ordinary skill in the art, the partial process flow to be described herein may be applied in the fabrication of many types of integrated circuits, in which the full process flow will include many other process steps conventional in the art.

Figure 1:
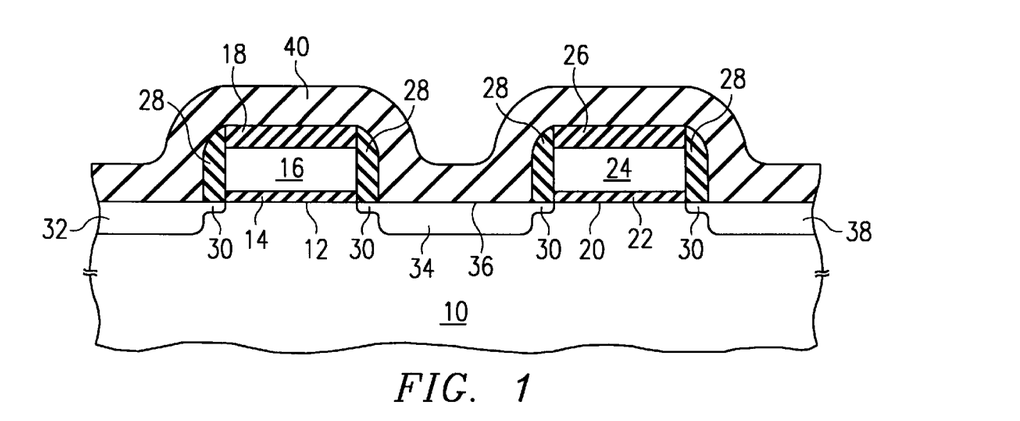
FIGS. 1–4 and 6–8 are cross-sectional views of the fabrication of a semiconductor integrated circuit according to one embodiment of the present invention.

FIG. 1 illustrates, in cross-section, a portion of an integrated circuit that has been partially fabricated. According to the example described herein, the present invention is directed to forming a landing pad between a metallization layer such as aluminum and an active region such as a doped semiconductor region in single-crystal silicon, as such contacts are generally the most sensitive to the misalignment and design rules for spacing addressed by the landing pad and the spiking and nodule problems addressed by the barrier layer. It is contemplated, of course, that the present invention will also be applicable to the formation of other contacts, including, for example, contacts between metallization and polysilicon.

The structure of FIG. 1, includes silicon substrate 10. Various active devices may be formed on or in the surface of the substrate as well as overlying any field oxide regions which may be formed to separate devices. In a particular application, substrate transistors 12 and 20 are shown having gate oxide layers 14 and 22, gate electrodes 16 and 24 overlying the gate oxide layers and typically formed from a first layer of polysilicon. As is known in the art, typically gate electrodes 16, 24 will have sidewall spacers 28, lightly doped drain regions 30 and source and drain or diffused regions 32, 34 shown for transistor 12 and diffused regions 34, 38 shown for transistor 20. Diffused or active region 34 may form a shared contact 36 between devices as is known in the art. In the preferred embodiment, diffused region 34 forms the source of one transistor and the drain of the adjacent transistor.

The diffused or active region 34 is formed of opposite conductivity type from that of substrate 10. For example, substrate 10 may be lightly doped p-type silicon and diffusion region 34 may be heavily doped n-type silicon. Of course, as rioted above, other structures (with the same or opposite conductivity type selection) may alternatively be used; for example, substrate 10 may instead be a well or tub region in a CMOS process, into which diffusion or active region 34 is formed. In the example of FIG. 1, diffusion 34 is bounded by both substrate transistors 12, 20. In this example, diffusion 34 is very shallow, such as on the order of 0.15 microns, as is conventional for modern integrated circuits having sub-micron feature sizes. As such, diffusion 34 may be formed by ion implantation of the dopant followed by a high-temperature anneal to form the junction, as is well known in the art. Alternatively, the ion implantation may be performed prior to the formation of subsequent layers, with the drive-in anneal performed later in the process, if desired.

In the preferred embodiment, transistors 12, 20 may also have a capping layer 18, 26, respectively. The capping layer may be formed directly over the polysilicon gate electrodes 16, 24 or over a polycide. The capping layer is preferably an oxide or nitride formed to encapsulate the gate electrode as more fully described in U.S. patent application Ser. No. 08/331691 (Attorney's Docket No. 94-C-86/88) filed on Oct. 31, 1994 and incorporated herein by reference. The capping layer is preferably formed to a depth of between approximately 500 to 2000 angstroms over the polysilicon before the polysilicon is patterned and etched to form the gate electrodes. The capping layer may then be patterned and etched with the polysilicon to cap only the polysilicon remaining which forms the gate electrodes. The sidewall spacers may then be formed after the capping layer is formed to further encapsulate the gate electrodes and increase the tolerance for design rules and provide sufficient distance between the gate electrodes and subsequently formed conductive regions adjacent to the transistor gates.

Dielectric layer 40, which may be a deposited oxide or another suitable dielectric layer, is formed over diffusion region 34 and other already formed devices such as transistors 12, 20. Dielectric layer 40, formed for purposes of electrically isolating overlying conductive structures from diffusion 34 and other devices except at locations where contacts are desired therebetween, may have a thickness of between approximately 500 to 2000 angstroms.

Figure 2A:
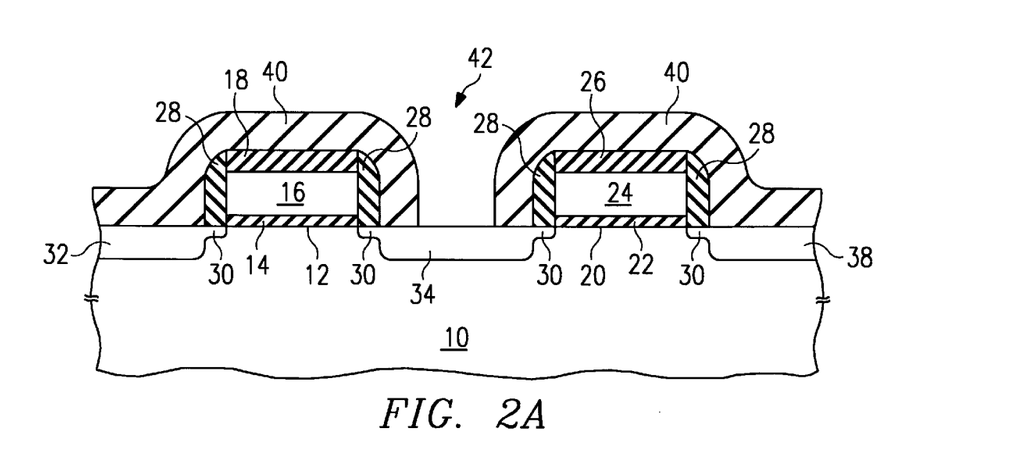
Figure 2B:
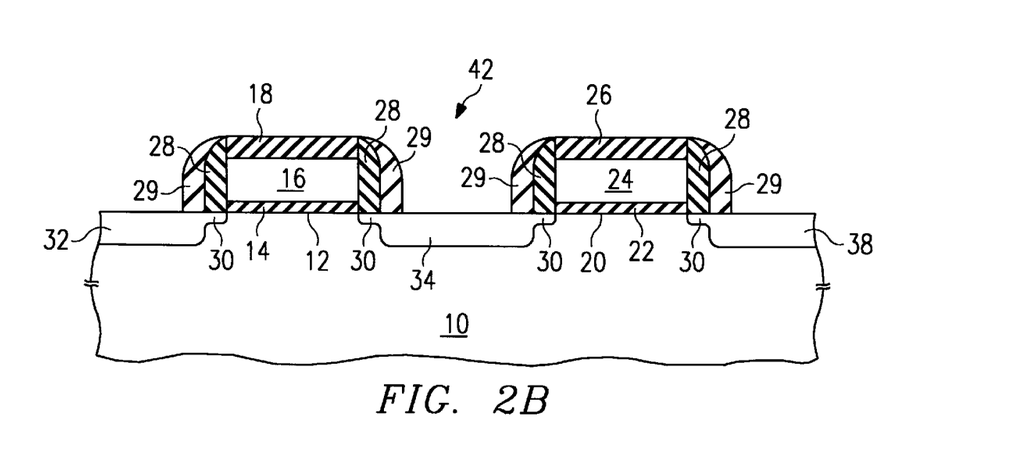

As shown in FIG. 2A, contact opening 42 is formed through dielectric layer 40, for example by way of reactive ion etching or another type of anisotropic etching; as will be apparent below, this embodiment of the invention is concerned with the formation of an overlying landing pad that is in contact with diffusion region 34 and under an overlying metallization layer subsequently formed. Dielectric layer 40 is; masked in order to primarily etch only opening 42 through layer 40. If dielectric layer 40 is etched without being masked, the upper surface of the layer is vertically etched essentially at the same rate as the opening. In this case, a second sidewall oxide spacer 29, as shown in FIG. 2B, is formed along the sides of sidewall spacers 28. These second sidewall spacers 29 will provide for a self-aligned contact to be made to the active or diffused region 34 and will increase the distance between the edge of the polysilicon gate 16, 24 and the edge of the contact opening 42. However, the distance from the top of the polysilicon gate 16, 24 to an overlying layer will depend on the thickness of the capping layer 18, 26.

With reference to FIG. 2A, misalignment of the contact opening 42 over the diffused region 34, such as opening over the sidewall spacers, may decrease the contact space between the edge of gate electrodes 12, 20 and the side of the contact opening 42. Due to any misalignment of the contact opening, effectively opening over the sidewall spacers 28 or 29 of either transistor 12, 20, the distance between these active areas may be reduced enough such that the design rules for a metal contact space to gate are not met and device yield may thus decrease. In addition, misalignment of the contact opening 42 increases the aspect ratio of the opening, increasing step coverage problems for metal contact. To prevent any misalignment of the opening 42 from removing the sidewall spacers, these sidewall spacers 28 may be formed of nitride. In the preferred embodiment, a material is formed in contact opening 42 whereby the design rules for contact space or side of contact 42 to edge of gates 12, 20 are met while enhancing the planarization of the surface topography to allow barrier layers and metal contacts to be uniformly formed.

Figure 3:
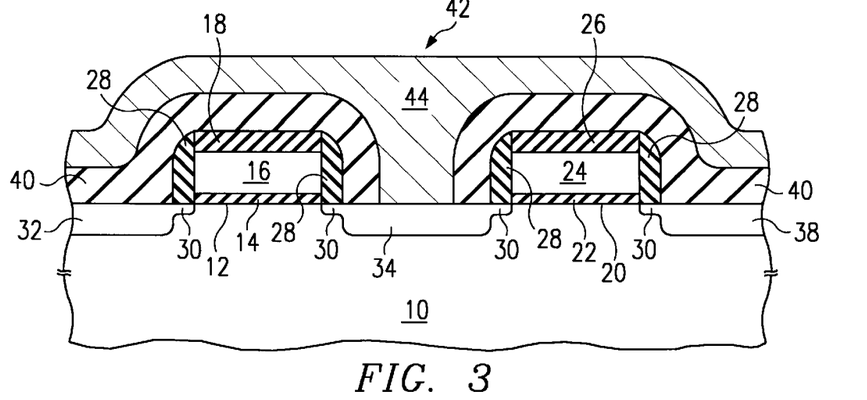

With reference to FIGS. 3–7, the present invention will be described following from FIG. 2A. It will be appreciated, however, from those skilled in the art that this invention may be practiced with the second sidewall spacer as shown in FIG. 2B. Referring now to FIG. 3, a polysilicon layer 44 is formed over dielectric layer 40 and in the contact opening 42 in contact with the diffused region 34. Polysilicon layer 44 is preferably deposited as an insitu doped polysilicon being doped with a similar dopant as the diffused region 34, such as by ion implantation or other suitable method. In this example, if the diffused region 34 is $N^+$, the polysilicon layer 44 may be $N^+$ insitu doped polysilicon as deposited with sufficient doping level to reduce the contact resistance of this layer and provide an adequate electrical path to the diffused region 34. In this example, the insitu doping level is approximately $10^{20}$ ions/cm$^3$ as formed. Polysilicon layer 44 will have a thickness sufficient to fill the contact opening 42.

Figure 4A:
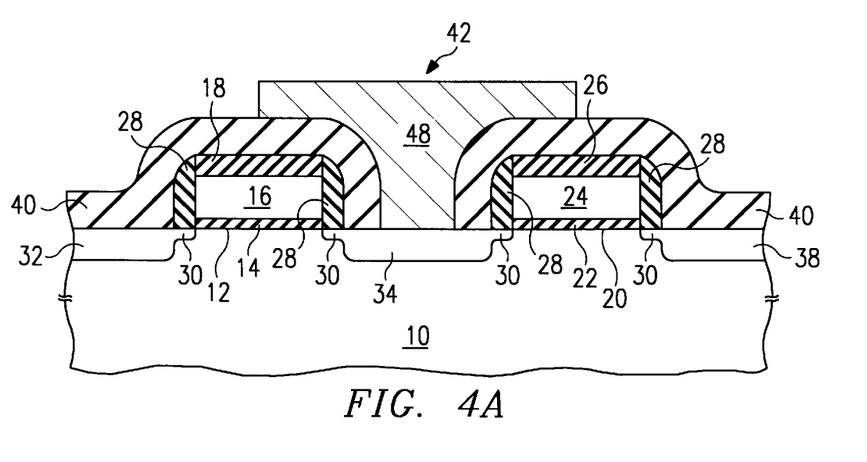

Referring to FIG. 4A, polysilicon layer 44 is patterned and etched to form a conductive landing pad 48, which in this example extends into the opening to the diffused region 34 and over a portion of the dielectric layer 40 adjacent the opening. Landing pad 48 will provide for proper design rules for spacing such as that between the contact edge in opening 42 and transistor gate edges of gates 12, 20 caused by such factors as smaller required geometries and misalignment of the contact openings over the active region 34. In this example, the height of the landing pad 48 above the dielectric layer 40 will be approximately the same as or greater than one-half of the width of the contact opening 42 to insure that the contact opening is adequately filled with polysilicon.

Figure 4B:
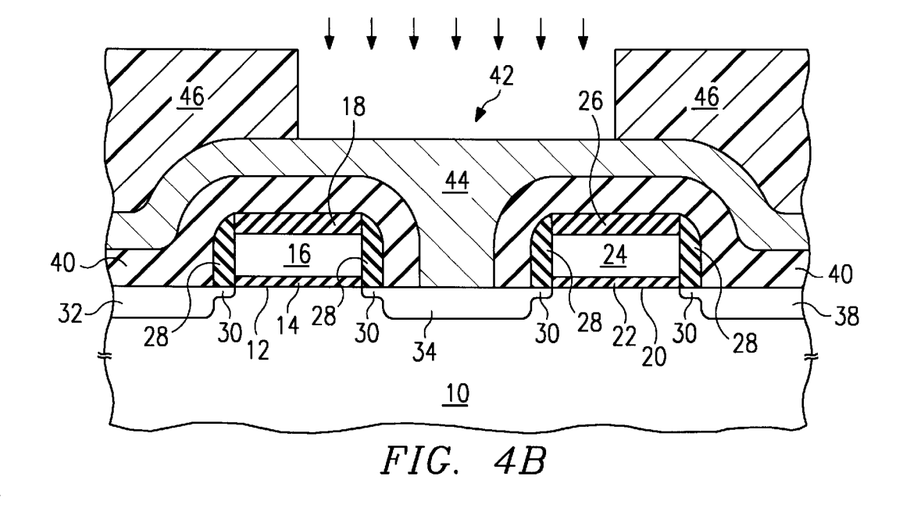

As shown in FIG. 4B, alternatively, polysilicon layer 44 may first be formed as an undoped polysilicon. Photoresist layer 46 is formed over the polysilicon layer 44 having an opening therethrough exposing a portion of the polysilicon layer 44 overlying the diffused region 34 and a portion of the dielectric layer 40. The polysilicon layer 44 is then doped with appropriate dopants, as shown by the arrows, preferably by implantation or other suitable method to lower the contact resistance of the polysilicon and form an adequate conductive path to the diffused region 34. The dosage is approximately $5 \times 10^{15}$ ions/cm2 at an energy level of approximately 40–150 KeV. The photoresist layer 46 is removed and the polysilicon layer is patterned and etched, resulting in the structure shown in FIG. 4A.

Referring to FIGS. 5A–5D, an alternative embodiment is described for forming the polysilicon landing pad. After the opening 42 is formed to the active or diffused region 34, a polysilicon layer is formed in the opening and over the dielectric layer 40. The polysilicon layer is etched back exposing an upper surface of the dielectric layer 40 forming a polysilicon plug 50 in the contact opening. As described above, the polysilicon may be N or P-type insitu deposited polysilicon to reduce the contact resistance of the polysilicon and form a conductive path to the diffused region 34.

Figure 5A:
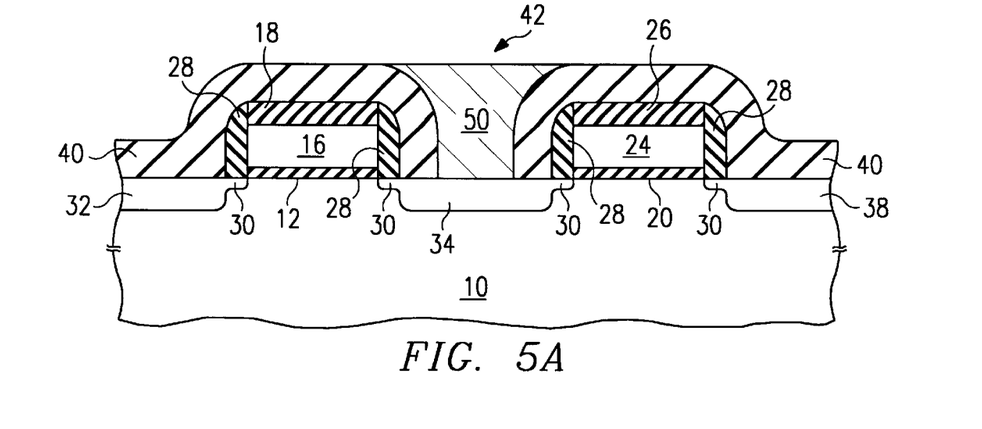
FIGS. 5A–5C are cross-sectional views of the fabrication of a semiconductor integrated circuit according to an alternative embodiment of the present invention.
Figure 5B:
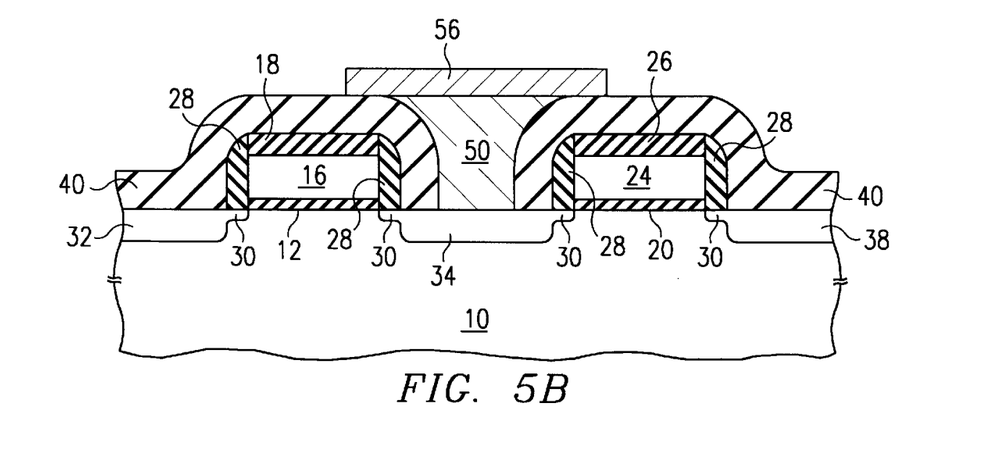

Referring to FIG. 5B, a second N or P-type insitu deposited polysilicon layer is formed over the polysilicon plug 50 and dielectric layer 40, patterned and etched to form the landing pad 56 over the polysilicon plug 50. In this example, the polysilicon landing pad 56 may have a thickness less than the polysilicon landing pad 48 described above with reference to FIG. 4A. Since the polysilicon plug in FIG. 5B has already been formed to fill the contact opening, the polysilicon landing pad need not have a thickness dimension similar to the width of the contact opening. A thinner upper landing pad may be formed which will further enhance the planarization of the surface of the wafer at this stage of manufacturing.

Figure 5C:
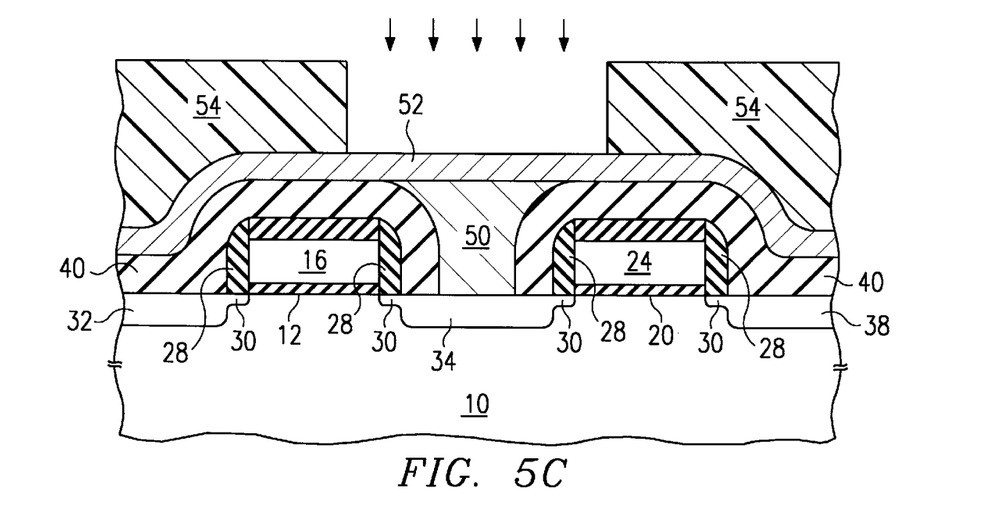

Referring to FIG. 5C, an alternative is shown for forming the conductive landing pad 56 (as shown in FIG. 5B). Polysilicon layer 52 is formed over the polysilicon plug 50 and dielectric layer 40 as an undoped polysilicon layer. Similar to the method described above with reference to FIG. 4B, photoresist layer 54 is formed over the undoped polysilicon layer 52 having an opening therethrough exposing a portion of the polysilicon layer 52 overlying the diffused region 34 and a portion of the dielectric layer 40. The polysilicon layer 52 is then doped with appropriate dopants, as shown by the arrows, again preferably by implantation or other suitable method to lower the contact resistance of the polysilicon and form an adequate conductive path to the diffused region 34. The dosage is approximately $5 \times 10^{15}$ ions/cm2 at an energy of approximately 25–50 KeV. The photoresist layer 54 is removed and the polysilicon layer is patterned and etched, resulting in the structure shown in FIG. 5B.

Figure 6:
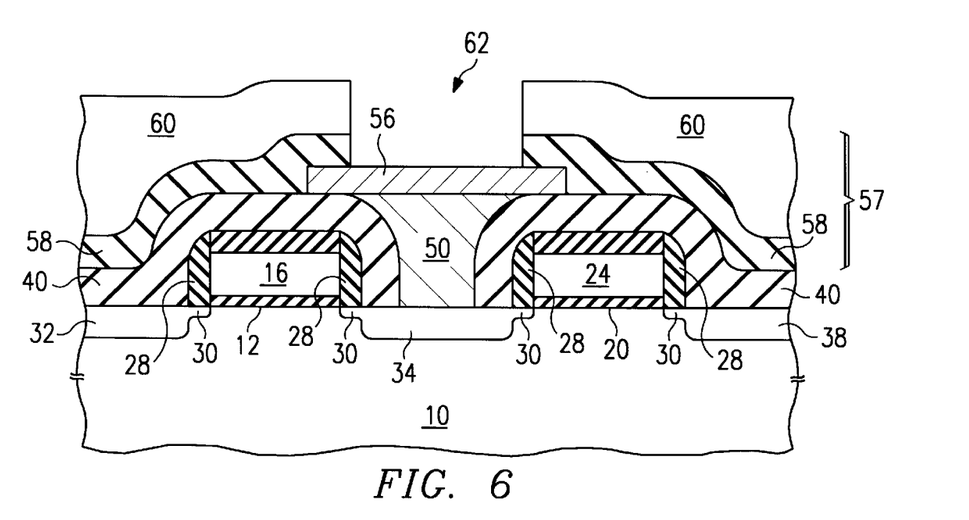

Referring to FIG. 6, subsequent process steps are shown. Reference will be made to the landing pad 56 as described above with reference to FIGS. 5A–5C, however, it will be appreciated that these subsequent process steps may also follow from the landing pad 48 as shown with reference to FIG. 4A. A second dielectric layer 57 is formed over the landing pad 56 and first dielectric layer 40. The second dielectric layer 57 may be, for example, a multi-layer film or a glass layer such as spin-on-glass or borophosphorous silicate glass (BPSG) to aid in planarization of the surface of the wafer at this stage of processing. An example of a multi-layer film may be an undoped oxide 58 formed under a BPSG layer 60. The undoped oxide may aid in protecting areas of the chip during subsequent processing steps and in particular will help to prevent the BPSG layer from forming directly on active areas which may not be covered by the first dielectric layer 40. The dielectric layer 57 will have a thickness dependent upon the underlying topography and may be between approximately 3000 to 12000 angstroms. An opening 62 is formed through the dielectric layer 57 exposing a portion of the landing pad 56. If BPSG is used for the second dielectric layer 57, as is known in the art, it can be reflowed to round the corners at the opening 62.

Figure 7:
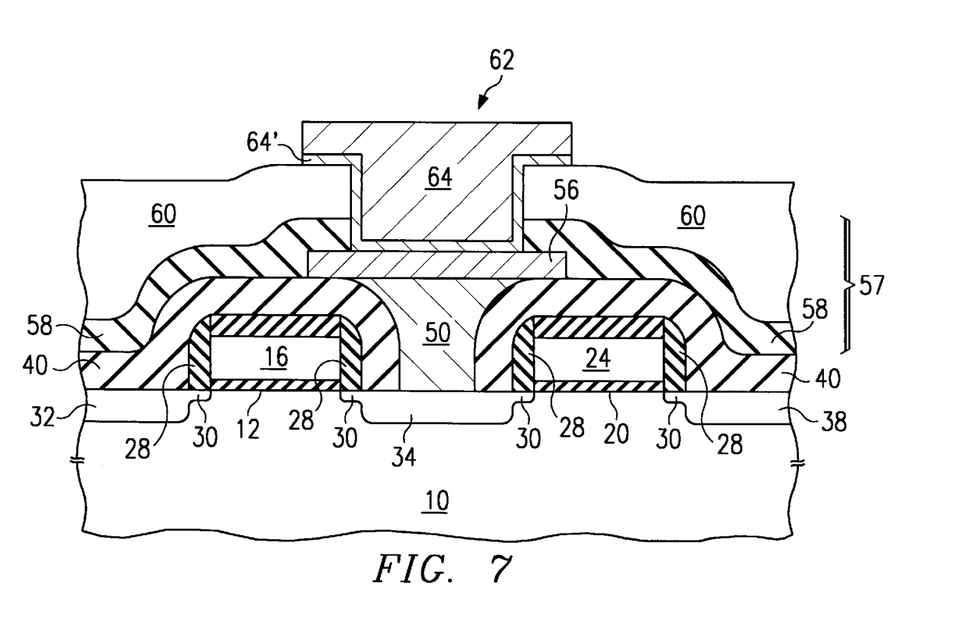

Referring to FIG. 7, a conductive layer is formed over the dielectric layer 57 and in opening 62, patterned and etched to form a conductive contact 64. Contact 64 may be an aluminum alloy or a composite barrier layer underlying an aluminum alloy, as is known in the art. A barrier layer formed under the metal contact may be necessary to reduce the well known wear out failure mechanisms referred to as stress induced migration and electromigration. A thin barrier layer 64' of a refractory metal or refractory metal nitride may be deposited in the opening 62 and over the second dielectric layer 57 by way of sputtering or other suitable method, to a thickness of about 400 to 1000 angstroms. As is known in the art, barrier layer 64' is preferably formed of titanium nitride or other suitable refractory metal nitride, or may be formed of titanium, titanium-tungsten, or other suitable refractory metal. The barrier layer may alternatively be formed of a refractory metal nitride over a refractory metal, for example, a titanium nitride may be formed over a titanium layer. The material and thickness of barrier layer 64' are selected to optimize process conditions to prevent diffusion of atoms between an overlying conductive layer and the underlying polysilicon landing pad 56.

The contact 64 makes electrical connection to diffused region 34, in this example, through landing pad 56 and polysilicon plug 50. Any misalignment of the width and location of the contact opening 62 over the landing pad is not as critical as the previous contact opening 42 to diffused region 34. With the landing pad formed between the contact 64 and the active region 34, the design rules for contact to gate spacing are maintained. A wider and/or more shallow contact opening 62 over the landing pad 56 may thus be formed to facilitate the deposition of a contact metal such as aluminum or other suitable contact metal with a barrier layer under the contact metal. The barrier layer will be able to form more uniformly along the sides and bottom of the contact opening and more particularly in the corners. In addition, some misalignment of contact opening 62 over the landing pad 56 will be tolerated without invalidating design rules, such misalignment of the contact opening 62 for a metal contact not being tolerated at the diffused region 34, in this example between transistors 12, 20.

A doped polysilicon landing pad, formed from a single layer or from multiple layers has the advantage of enhancing planarization and improving the barrier and metal contact step coverage by reducing the aspect ratio in a metal contact. The polysilicon may be formed in various ways to more easily adapt to modern manufacturing techniques. Additionally, nitride spacers may be used for the substrate transistors to self-align the contact opening for the polysilicon to active area contact and to thereby decrease the overall cell area without invading required design rules.

Figure 8:
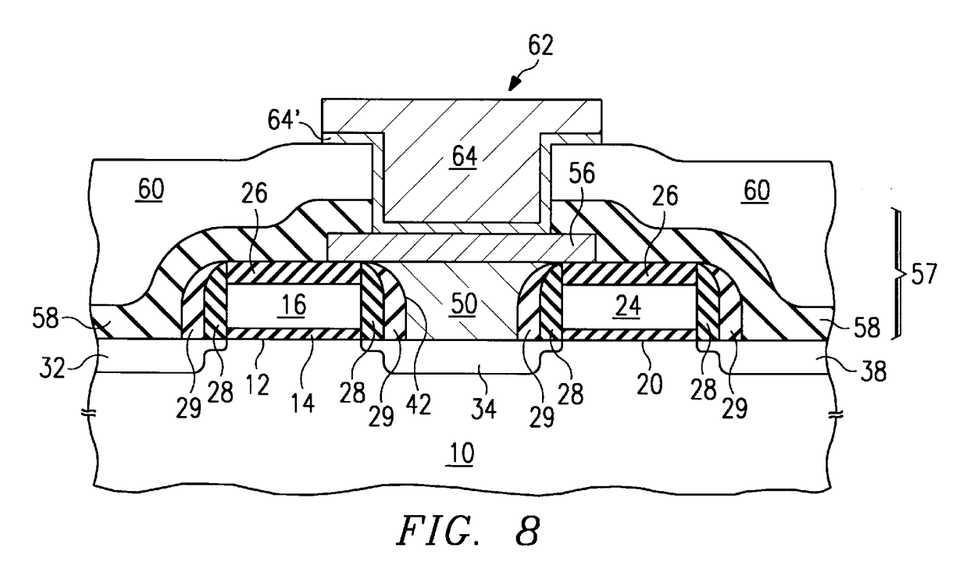

Referring to FIG. 8, an additional alternative for forming a self-aligned contact is shown. If layer 40 is unmasked when etched to form opening 42, as described above with reference to FIG. 2B, sidewall oxide spacers 29 are formed along the sides of sidewall spacers 28. With the capping layer 18, 26 over the polysilicon gate electrodes 16, 24, the design rules should be maintained for the polysilicon landing pad. Without the additional height over the capping layer 18, 26, this method provides additional planarization for subsequently formed layers. It may be important, however, to leave some oxide over substrate areas so that the polysilicon layer does not directly contact the substrate. If this situation occurs, there may be an undesired result of etching the silicon substrate along with the polysilicon.

While the invention has been described herein relative to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

What is claimed is:

1. A method of forming a portion of a semiconductor integrated circuit; comprising the steps of:

forming an active region on a substrate;

forming a first dielectric layer having a first opening the through exposing a portion of the active region;

filling the opening with a first conductive material;

forming a landing pad over the first conductive material and a portion of the first dielectric layer adjacent the first opening; the landing pad and the first conductive material comprising a doped polysilicon, wherein the first conductive material and landing pad are formed from different polysilicon layers; and forming a second dielectric layer over the landing pad and a portion of the first dielectric layer; the second dielectric layer having a second opening therethrough exposing a portion of the landing pad; wherein the second opening has a smaller aspect ratio tan the first opening.

2. The method of claim 1, wherein the first dielectric layer adjacent the first opening comprises an undoped oxide layer overlying a device structure adjacent the active region.

3. The method of claim 1, wherein the first dielectric layer adjacent the first opening comprises a portion of an oxide capping layer overlying a transistor adjacent the active region and a plurality of sidewall spacers along the side of the transistor adjacent the first opening.

4. The method of claim 1, further comprising the step of:

forming a second conductive layer in the second opening.

5. The method of claim 4, wherein the second conductive layer comprises an aluminum alloy.

6. The method of claim 4, wherein the second conductive layer comprises an aluminum alloy/barrier composite bilayer.

7. The method of claim 1, wherein the active region is a shared contact in an upper portion of the substrate.

8. The method of claim 1, wherein the second dielectric layer comprises BPSG.

9. The method of claim 1, wherein the second dielectric layer comprises an undoped oxide layer underlying a BPSG layer.

10. The method of claim 1, wherein the second dielectric layer has a thickness of about 3000 to 12000 angstroms.

11. A method of forming a portion of a semiconductor integrated circuit; comprising the steps of:

forming a plurality of devices over a portion of a substrate;

forming an active region in the substrate between at least two devices;

forming a first dielectric layer over the devices and the active region; the first dielectric layer having a thickness of between approximately 500 and 2000 angstroms;

etching the first dielectric layer to form a first opening exposing a portion of the active region;

forming a doped polysilicon layer to a thickness above the first dielectric layer sufficient to insure that the contact opening is filled with polysilicon over the exposed portion of the active region;

patterning and etching the doped polysilicon layer to form a landing pad; the landing pad remaining in the opening and over a portion of the first dielectric layer adjacent the first opening;

forming a second dielectric layer over the landing pad and the first dielectric layer not covered by the landing pad; and patterning and etching the second dielectric layer to form a second opening exposing a portion of the landing pad; wherein the second opening has a lower aspect ratio than the first opening.

12. The method of claim 11, wherein the devices comprise transistors, each transistor having a gate oxide, a gate electrode and sidewall spacers.

13. The method of claim 12, wherein the transistor spacers comprise oxide.

14. The method of claim 12, wherein the transistor spacers comprise nitride.

15. The method of claim 12, wherein the transistors further comprise a capping layer.

16. The method of claim 15, wherein the capping layer comprises an oxide.

17. The method of claim 15, wherein the first dielectric adjacent the first opening comprises a portion of the capping layer and the sidewall spacers.

18. The method of claim 11, wherein the first dielectric adjacent the first opening comprises an undoped oxide layer overlying the devices adjacent the active region.

19. The method of claim 11, further comprising the step of:

forming a conductive contact in the second opening.

20. The method of claim 11, wherein the forming the doped polysilicon layer further comprises the steps of:

depositing an insitu doped polysilicon layer in the first opening and over the first dielectric layer; and patterning and etching the deposited polysilicon layer to form a landing pad; the landing pad remaining in the first opening and over a portion of the first dielectric layer adjacent the opening.

21. The method of claim 20, wherein the thickness of the portion of the landing pad above the first dielectric layer is substantially similar to the width of the portion of the landing pad in the opening.

22. The method of claim 11, wherein the polysilicon landing pad is undoped as formed and wherein the forming the doped polysilicon layer further comprises the steps of:

before the step of patterning and etching the polysilicon layer, forming a photoresist over the undoped polysilicon layer, the photoresist layer having an opening therethrough to expose a portion of the polysilicon layer over a portion of the first opening;

implanting the polysilicon layer with a dopant with sufficient energy and dosage to provide an adequate conductive path to the active region; and removing the photoresist.

23. The method of claim 11, wherein the forming the doped polysilicon layer further comprises the steps of:

depositing a first polysilicon layer in the first opening and over the first dielectric layer;

etching the first polysilicon layer to form a polysilicon plug in the first opening;

forming a second polysilicon layer over the polysilicon plug and the first dielectric layer; and patterning and etching the second polysilicon layer to form a landing pad, the landing pad remaining over the polysilicon plug and a portion of the first dielectric layer.

24. The method of claim 23, wherein the thickness of the portion of the landing pad above the first dielectric layer is less than the width of the portion of the polysilicon plug in the opening.

25. The method of claim 11, wherein the first and second polysilicon layers are undoped when formed, and wherein the forming the doped polysilicon layer further comprises the steps of:

before the step of patterning and etching the second polysilicon layer, forming a photoresist over the second polysilicon layer, the photoresist layer having an opening therethrough to expose a portion of the second polysilicon layer over a portion of the polysilicon plug;

implanting the second polysilicon layer with a dopant with sufficient energy and dosage to provide an adequate conductive path to the active region; and removing the photoresist.

26. The method of claim 11, wherein the first polysilicon layer is insitu doped when formed and the second polysilicon layer is undoped when formed, and wherein the forming the doped polysilicon layer further comprises the steps of:

before the step of patterning and etching the second polysilicon layer; forming a photoresist over the second polysilicon layer, the photoresist layer having an opening therethrough to expose a portion of the second polysilicon layer over a portion of the polysilicon plug;

implanting the second polysilicon layer with a dopant with sufficient energy and dosage to provide an adequate conductive path to the active region; and removing the photoresist.

27. The method of claim 11, wherein the first and second polysilicon layers are both insitu doped when formed.

28. A method of forming a portion of a semiconductor integrated circuit; comprising the steps of:

forming an active region on a substrate;

forming a first dielectric layer having a first opening therethrough exposing a portion of the active region;

filling the opening with a first conductive material;

forming a landing pad over the first conductive material and a portion of the first dielectric layer adjacent the first opening; the landing pad and the first conductive material comprising a doped polysilicon, wherein the first conductive material and landing pad are formed from different polysilicon layers, wherein the thickness of the landing pad above the first dielectric layer is substantially similar to the width of the conductive material in the opening; and forming a second dielectric layer over the landing pad and a portion of the first dielectric layer; the second dielectric layer having a second opening therethrough exposing a portion of the landing pad; wherein the second opening has a smaller aspect ratio than the first opening.

29. A method of forming a portion of a semiconductor integrated circuit; comprising the steps of:

forming an active region on a substrate;

forming a first dielectric layer having a first opening therethrough exposing a portion of the active region;

filling the opening with a first conductive material;

forming a landing pad over the first conductive material and a portion of the first dielectric layer adjacent the first opening; the landing pad and the first conductive material comprising a doped polysilicon, wherein the first conductive material and landing pad are formed from different polysilicon layers, wherein the thickness of the landing pad above the first dielectric layer is less than the width of the conductive material in the opening; and forming a second dielectric layer over the landing pad and a portion of the first dielectric layer; the second dielectric layer having a second opening therethrough exposing a portion of the landing pad; wherein the second opening has a smaller aspect ratio than the first opening.

* * * * *